(12) United States Patent
Sugiyama et al.

(10) Patent No.: US 9,737,973 B2
(45) Date of Patent: Aug. 22, 2017

(54) SUBSTRATE PROCESSING APPARATUS

(71) Applicant: Ebara Corporation, Tokyo (JP)

(72) Inventors: Mitsunori Sugiyama, Tokyo (JP); Kunimasa Matsushita, Tokyo (JP)

(73) Assignee: Ebara Corporation, Tokyo (JP)

( * ) Notice: Subject to any disclaimer, the term of this patent is extended or adjusted under 35 U.S.C. 154(b) by 266 days.

(21) Appl. No.: 14/682,774

(22) Filed: Apr. 9, 2015

(65) Prior Publication Data

US 2015/0290767 A1 Oct. 15, 2015

(30) Foreign Application Priority Data

Apr. 10, 2014 (JP) ................... 2014-081013

(51) Int. Cl.
| | | |
|---|---|---|
| *B24B 27/00* | (2006.01) | |
| *B24B 53/007* | (2006.01) | |
| *B24B 51/00* | (2006.01) | |
| *B24B 49/00* | (2012.01) | |
| *H01L 21/67* | (2006.01) | |

(52) U.S. Cl.
CPC ........ *B24B 53/007* (2013.01); *B24B 27/0023* (2013.01); *B24B 27/0069* (2013.01); *B24B 27/0076* (2013.01); *B24B 49/00* (2013.01); *B24B 51/00* (2013.01); *H01L 21/67219* (2013.01)

(58) Field of Classification Search
CPC . B24B 25/00; B24B 27/0023; B24B 27/0069; B24B 27/0076; B24B 37/345; B24B 49/00; B24B 51/00; B24B 53/007; B24B 53/017; H01L 21/68707
See application file for complete search history.

(56) References Cited

U.S. PATENT DOCUMENTS

| | | | | |
|---|---|---|---|---|
| 6,244,941 | B1* | 6/2001 | Bowman | ................ B24B 37/11 451/287 |
| 6,364,745 | B1* | 4/2002 | Gonzalez-Martin | .... B24B 37/04 257/E21.228 |
| 7,249,992 | B2* | 7/2007 | Kalenian | ................. B24B 37/30 451/11 |
| 2015/0071742 | A1* | 3/2015 | Matsuzawa | ....... H01L 21/67253 414/226.05 |
| 2015/0192921 | A1* | 7/2015 | Sugiyama | ............ G05B 19/418 700/121 |

(Continued)

FOREIGN PATENT DOCUMENTS

JP 2009-200476 A 9/2009

*Primary Examiner* — Timothy V Eley
(74) *Attorney, Agent, or Firm* — Leydig, Voit & Mayer, Ltd.

(57) ABSTRACT

A CMP apparatus includes a polishing unit 3, a cleaning unit 4, a load/unload unit 2, a transfer unit, and a control section 5 configured to control transfer of a substrate in the transfer unit. When the polishing unit includes a plurality of polishing sections, or the cleaning unit includes a plurality of cleaning sections, the control section 5 can set a test mode that operates the polishing section or the cleaning section for a test to some of the plurality of polishing sections, or some of the plurality of cleaning sections, causes a substrate to be transferred to the polishing section or the cleaning section to which the test mode is not set, and causes a test substrate different from the substrate to be transferred to the polishing section or the cleaning section to which the test mode is set.

10 Claims, 7 Drawing Sheets

(56) References Cited

U.S. PATENT DOCUMENTS

| | | | | |
|---|---|---|---|---|
| 2015/0198947 A1* | 7/2015 | Sugiyama | ........ | G05B 19/41875 700/110 |
| 2015/0204711 A1* | 7/2015 | Sugiyama | ........... | G01F 25/0007 451/73 |
| 2015/0290766 A1* | 10/2015 | Sugiyama | ............. | B24B 53/007 451/444 |

* cited by examiner

SUBSTRATE PROCESSING APPARATUS

CROSS-REFERENCE TO RELATED APPLICATION

This application is based upon and claims the benefit of priority of the prior Japanese Patent Application No. 2014-081013, filed on Apr. 10, 2014, the entire contents of which are incorporated herein by reference.

TECHNICAL FIELD

The present invention relates to a substrate processing apparatus.

BACKGROUND ART

In recent years, substrate processing apparatuses have been used to perform various kinds of processing for substrates such as semiconductor wafers. As one example of the substrate processing apparatus, a CMP (Chemical Mechanical Polishing) apparatus for performing polishing processing of substrates is cited.

A CMP apparatus includes a polishing unit for performing polishing processing of a substrate, a cleaning unit for performing cleaning processing and drying processing of a substrate, a load/unload unit that delivers a substrate to the polishing unit and receives a substrate for which the cleaning processing and the drying processing are performed by the cleaning unit, and the like. Further, the CMP apparatus includes a transfer unit that performs transfer of substrates in the polishing unit, the cleaning unit and the load/unload unit. The CMP apparatus sequentially performs various kinds of processing of polishing, cleaning and drying while transferring substrates by the transfer unit.

Incidentally, it is known that the transfer unit performs transfer for optimizing substrate processing efficiency when the polishing unit includes a plurality of polishing sections, and the cleaning unit includes a plurality of cleaning sections. That is to say, when the transfer unit transfers a substrate to the polishing unit from the load/unload unit, the transfer unit transfers the substrate to a polishing section that can perform polishing processing for the substrate the soonest among the plurality of polishing sections. Further, when the transfer unit transfers a substrate to the cleaning unit from the polishing unit, the transfer unit transfers the substrate to the cleaning section that can perform cleaning processing for the substrate the soonest among the plurality of cleaning sections.

Here, when some of the plurality of polishing sections, or some of the plurality of cleaning sections cannot be used due to maintenance or the like, the transfer unit transfers the substrate to the polishing section or the cleaning section which is not under maintenance. Further, when maintenance of the polishing section or the cleaning section is ended, the transfer unit transfers a test substrate which is different from a substrate for production to the polishing section or the cleaning section the maintenance of which is finished, in order to examine whether or not the polishing section or the cleaning section the maintenance of which is finished operates normally.

CITATION LIST

Patent Literature

Patent Literature 1: Japanese Patent Laid-Open No. 2009-200476

However, the prior art does not give consideration to increasing substrate processing efficiency during execution of a test on the polishing section or the cleaning section.

That is to say, when maintenance of the polishing section or the cleaning section is finished in the prior art, if a test on the polishing section or the cleaning section the maintenance of which is ended is to be conducted while processing for a substrate for production continues, the substrate for production is likely to be transferred to the polishing section or the cleaning section which is a test target. Therefore, in the prior art, when a test on the polishing section or the cleaning section is conducted, a test substrate is transferred to the polishing section or the cleaning section which is the test target, after processing of the substrates for production is stopped. According to the prior art, when a test on the polishing section or the cleaning section is executed, processing for the substrates for production is stopped; and therefore, the substrate processing efficiency is likely to be reduced.

Therefore, the invention of the present application addresses an issue to improve substrate processing efficiency during execution of a test on a polishing section or a cleaning section.

SUMMARY OF INVENTION

One aspect of a substrate processing apparatus of the invention of the present application is made in the light of the above described problem, and includes a polishing unit including at least one polishing section configured to polish a substrate, a cleaning unit including at least one cleaning section configured to clean a substrate polished by the polishing unit, a load/unload unit configured to deliver a substrate to the polishing unit and receive a substrate from the cleaning unit, a transfer unit configured to transfer a substrate among the polishing unit, the cleaning unit and the load/unload unit, and a control section configured to control transfer of a substrate in the transfer unit, wherein when the polishing unit includes a plurality of the polishing sections, or the cleaning unit includes a plurality of the cleaning sections, the control section can set a test mode that operates the polishing section or the cleaning section for a test to some of the plurality of polishing sections, or some of the plurality of cleaning sections, causes the transfer unit to transfer the substrate to the polishing section or the cleaning section to which the test mode is not set, and causes the transfer unit to transfer a test substrate that is different from the substrate to the polishing section or the cleaning section to which the test mode is set.

Further, in one aspect of the substrate processing apparatus, the control section can set a maintenance mode indicating that the polishing section or the cleaning section is under maintenance to some of the plurality of polishing sections, or some of the plurality of cleaning sections, and causes the transfer unit to transfer the substrate to the polishing section or the cleaning section to which the maintenance mode is not set.

Further, in one aspect of the substrate processing apparatus, when maintenance of some of the plurality of polishing sections or some of the plurality of cleaning sections to which the maintenance mode is set is ended, the control section sets the test mode to the polishing sections or the cleaning sections.

Further, in one aspect of the substrate processing apparatus, the control section can set a normal mode to the polishing sections or the cleaning sections to which neither the test mode nor the maintenance mode is set, causes the transfer unit to transfer the substrate to the polishing section which can perform polishing processing of the substrate the soonest out of the polishing sections to which the normal mode is set, and causes the transfer unit to transfer the substrate to the cleaning section which can perform cleaning processing of the substrate the soonest out of the cleaning sections to which the normal mode is set.

According to the invention of the present application, the substrate processing efficiency during execution of a test on the polishing section or the cleaning section can be increased.

DESCRIPTION OF EMBODIMENTS

Hereinafter, a substrate processing apparatus according to one embodiment of the invention of the present application will be described based on the drawings. Hereinafter, as one example of the substrate processing apparatus, a CMP apparatus will be described, but the substrate processing apparatus is not limited to the CMP apparatus. Further, hereinafter, the substrate processing apparatus including a load/unload unit 2, a polishing unit 3 and a cleaning unit 4 will be described, but the substrate processing apparatus is not limited to this.

First, a configuration of the CMP apparatus will be described, and thereafter, an increase in substrate processing efficiency during execution of a test on a polishing section or a cleaning section will be described.

<Substrate Processing Apparatus>

Figure 1:
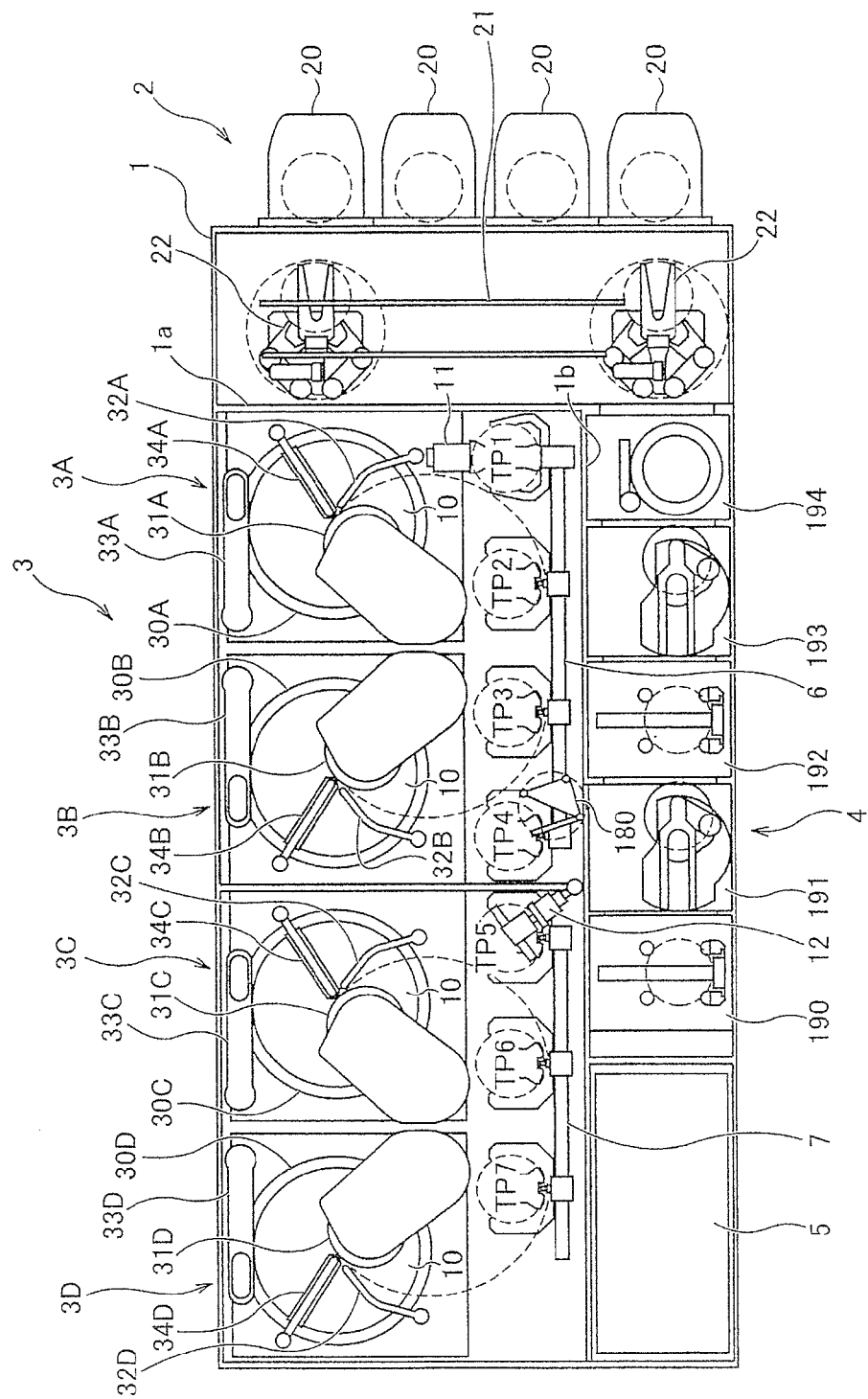
FIG. 1 is a plan view showing an entire configuration of a substrate processing apparatus of a present embodiment.

FIG. 1 is a plan view showing an entire configuration of the substrate processing apparatus according to one embodiment of the present invention. As shown in FIG. 1, the CMP apparatus includes a substantially rectangular housing 1. An inside of the housing 1 is divided into the load/unload unit 2, the polishing unit 3 and the cleaning unit 4 by partition walls 1a and 1b. The load/unload unit 2, the polishing unit 3 and the cleaning unit 4 are respectively assembled independently, and are evacuated independently. Further, the cleaning unit 4 has a control section 5 that controls a substrate processing operation. The control section 5 controls transfer of substrates in a transfer unit that transfers substrates among the polishing unit 3, the cleaning unit 4 and the load/unload unit 2. Details of this point will be described later.

<Load/Unload Unit>

The load/unload unit 2 includes two or more (four in the present embodiment) front load sections 20 on which wafer cassettes where a number of wafers (substrates) are stored are placed. These front load sections 20 are disposed adjacently to the housing 1, and are arranged along a width direction (a direction perpendicular to a longitudinal direction) of the substrate processing apparatus. On the front load section 20, a carrier for storing wafers, such as an open cassette, a SMIF (Standard Manufacturing Interface) pod, or a FOUP (Front Opening Unified Pod) can be mounted. Here, a SMIF and a FOUP are closed vessels that can keep environments independent from an external space by housing wafer cassettes inside and being covered with partition walls.

Further, in the load/unload unit 2, a travel mechanism 21 is laid along alignment of the front load sections 20, and on the travel mechanism 21, two transfer robots (loaders, transfer mechanisms) 22 that are movable along an arrangement direction of the wafer cassettes are installed. The transfer robots 22 are configured to be accessible to the wafer cassettes which are mounted on the front load sections 20 by moving on the travel mechanism 21. Each of the transfer robots 22 includes two hands up and down. An upper hand is used when a processed wafer is returned to the wafer cassette. A lower hand is used when a wafer before processing is taken out from the wafer cassette. In this manner, the upper and lower hands can be properly used. Further, the lower hand of the transfer robot 22 is configured to be able to rotate a wafer inversely by rotating around an axis thereof.

The load/unload unit 2 is a region that needs to keep the cleanest state; and therefore, an inside of the load/unload unit 2 is always kept under a pressure higher than any of an outside of the CMP apparatus, the polishing unit 3, and the cleaning unit 4. The polishing unit 3 is the dirtiest region because the polishing unit 3 uses slurry as a polishing fluid. Accordingly, a negative pressure is formed inside the polishing unit 3, and the pressure is kept to be lower than an internal pressure of the cleaning unit 4. The load/unload unit 2 is provided with a filter fan unit (not illustrated) having a clean air filter such as a HEPA filter, a ULPA filter or a chemical filter, and from the filter fan unit, clean air from which particles, poisonous steam, and a poisonous gas are removed always blows off.

<Polishing Unit>

The polishing unit 3 is a region where polishing (flattening) of a wafer is performed. The polishing unit 3 includes a first polishing section 3A, a second polishing section 3B, a third polishing section 3C and a fourth polishing section 3D. The first polishing section 3A, the second polishing section 3B, the third polishing section 3C and the fourth polishing section 3D are arranged along a longitudinal direction of the substrate processing apparatus as shown in FIG. 1.

As shown in FIG. 1, the first polishing section 3A includes a polishing table 30A to which a polishing pad 10 having a polishing surface is mounted. The first polishing section 3A includes a top ring 31A for polishing a wafer while holding the wafer and pressing the wafer to the polishing pad 10 on the polishing table 30A. The first polishing section 3A includes a polishing fluid supply nozzle 32A for supplying the polishing fluid and a dressing liquid (for example, pure water) to the polishing pad 10. The first polishing section 3A includes a dresser 33A for performing dressing of the polishing surface of the polishing pad 10. The first polishing section 3A includes an atomizer 34A that atomizes a mixture fluid of a liquid (pure water, for example) and a gas (a nitrogen gas, for example) or a liquid (pure water, for example) and spraying the mixture fluid or the liquid to the polishing surface.

Likewise, the second polishing section 3B includes a polishing table 30B to which the polishing pad 10 is mounted, a top ring 31B, a polishing fluid supply nozzle 32B, a dresser 33B and an atomizer 34B. The third polishing section 3C includes a poising table 30C to which the polishing pad 10 is mounted, a top ring 31C, a polishing fluid supply nozzle 32C, a dresser 33C and an atomizer 34C. The fourth polishing section 3D includes a polishing table 30D to which the polishing pad 10 is mounted, a top ring 31D, a polishing fluid supply nozzle 32D, a dresser 33D and an atomizer 34D.

Since the first polishing section 3A, the second polishing section 3B, the third polishing section 3C and the fourth polishing section 3D have the same configurations as one another, the first polishing section 3A will be described hereinafter.

Figure 2:
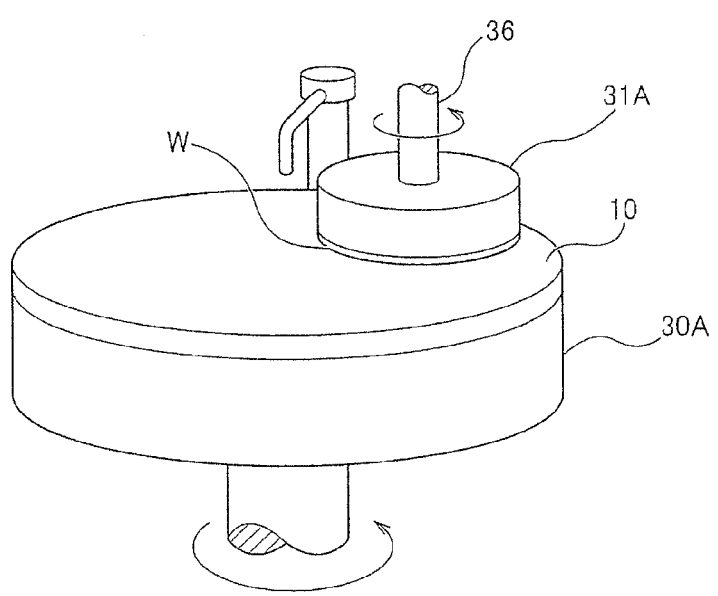
FIG. 2 is a perspective view schematically showing a polishing section.

FIG. 2 is a perspective view schematically showing the first polishing section 3A. The top ring 31A is supported by a top ring shaft 36. The polishing pad 10 is pasted on a top surface of the polishing table 30A. A top surface of the polishing pad 10 forms a polishing surface that polishes a wafer W. Fixed abrasive grains can be also used in place of the polishing pad 10. The top ring 31A and the polishing table 30A are configured to rotate around axes thereof as shown by the arrows. The wafer W is held by vacuum suction by an undersurface of the top ring 31A. During polishing, the polishing fluid is supplied to the polishing surface of the polishing pad 10 from the polishing fluid supply nozzle 32A, and the wafer W which is a polishing target is pressed to the polishing surface by the top ring 31A and is polished.

<Transfer Unit>

Next, a transfer mechanism (a transfer unit) for transferring a wafer will be described. As shown in FIG. 1, a first linear transporter 6 is disposed adjacently to the first polishing section 3A and the second polishing section 3B. The first linear transporter 6 is a mechanism that transfers a wafer among four transfer positions along a direction in which the polishing sections 3A and 3B are arranged (a first transfer position TP1, a second transfer position TP2, a third transfer position TP3, and a fourth transfer position TP4 in sequence from the load/unload unit side).

Further, a second linear transporter 7 is disposed adjacently to the third polishing section 3C and the fourth polishing section 3D. The second linear transporter 7 is a mechanism that transfers a wafer among three transfer positions along a direction in which the polishing sections 3C and 3D are arranged (a fifth transfer position TP5, a sixth transfer position TP6 and a seventh transfer position TP7 in sequence from the load/unload unit side).

Wafers are transferred to the polishing sections 3A and 3B by the first linear transporter 6. The top ring 31A of the first polishing section 3A moves between a polishing position and the second transfer position TP2 by a swing action of a top ring head. Accordingly, delivery of a wafer to the top ring 31A is performed at the second transfer position TP2. Likewise, the top ring 31B of the second polishing section 3B moves between a polishing position and the third transfer position TP3. Delivery of a wafer to the top ring 31B is performed at the third transfer position TP3. The top ring 31C of the third polishing section 3C moves between a polishing position and the sixth transfer position TP6. Delivery of a wafer to the top ring 31C is performed at the sixth transfer position TP6. The top ring 31D of the fourth polishing section 3D moves between a polishing position and the seventh transfer position TP7. Delivery of a wafer to the top ring 31D is performed at the seventh transfer position TP7.

At the first transfer position TP1, a lifter 11 for receiving a wafer from the transfer robot 22 is disposed. The wafer is transferred to the first linear transporter 6 from the transfer robot 22 via the lifter 11. A shutter (not illustrated) is provided at the partition wall 1a by being located between the lifter 11 and the transfer robot 22. At a time of transfer of a wafer, the shutter is opened so that the wafer is transferred to the lifter 11 from the transfer robot 22. Further, among the first linear transporter 6, the second linear transporter 7 and the cleaning unit 4, a swing transporter 12 is disposed. The swing transporter 12 has a hand that is movable between the fourth transfer position TP4 and the fifth transfer position TP5. Delivery of a wafer to the second linear transporter 7 from the first linear transporter 6 is performed by the swing transporter 12. The wafer is transferred to the third polishing section 3C and/or the fourth polishing section 3D by the second linear transporter 7. Further, the wafer which is polished in the polishing unit 3 is transferred to the cleaning unit 4 via the swing transporter 12.

<Cleaning Unit>

Figure 3A:
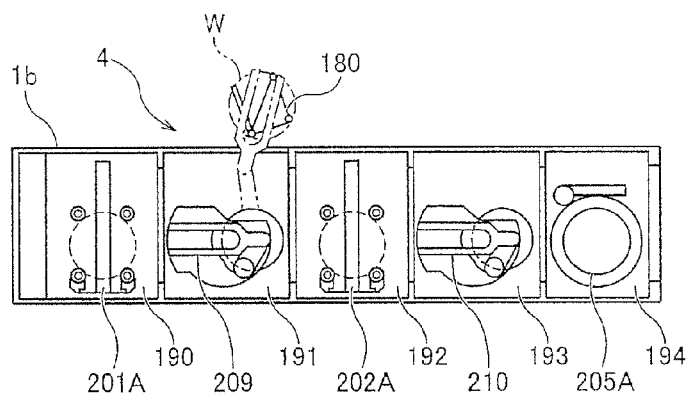
FIG. 3A is a plan view showing a cleaning unit.
Figure 3B:
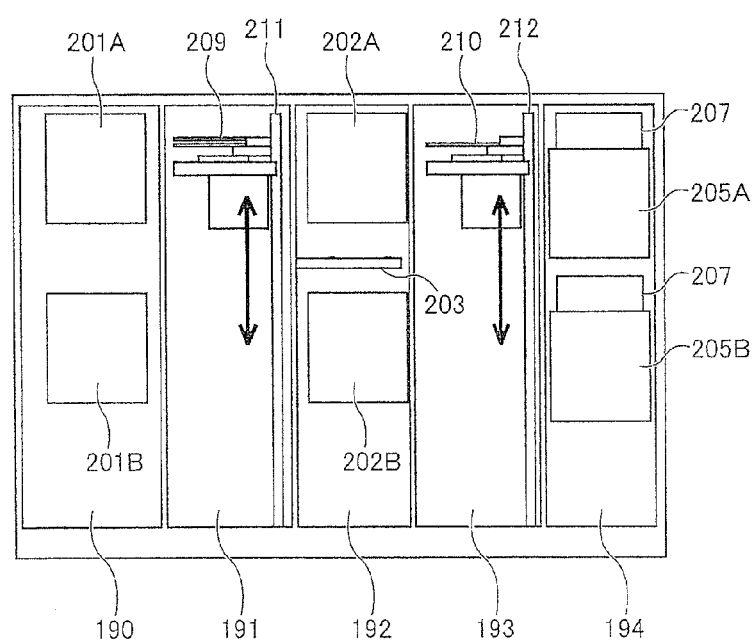
FIG. 3B is a side view showing the cleaning unit.

FIG. 3A is a plan view showing the cleaning unit 4. FIG. 3B is a side view showing the cleaning unit 4. As shown in FIGS. 3A and 3B, the cleaning unit 4 is divided into a first cleaning chamber 190, a first transfer chamber 191, a second cleaning chamber 192, a second transfer chamber 193, and a drying chamber 194. In the first cleaning chamber 190, an upper primary cleaning module (cleaning section) 201A and a lower primary cleaning module (cleaning section) 201B which are arranged along a vertical direction are disposed. The upper primary cleaning module 201A is disposed above the lower primary cleaning module 201B. Likewise, in the second cleaning chamber 192, an upper secondary cleaning module (cleaning section) 202A and a lower secondary cleaning module (cleaning section) 202B which are arranged along the vertical direction are disposed. The upper secondary cleaning module 202A is disposed above the lower secondary cleaning module 202B. The primary and secondary cleaning modules 201A, 201B, 202A and 202B are cleaning machines that clean wafers by using a cleaning fluid. These primary and secondary cleaning modules 201A, 201B, 202A and 202B are arranged along the vertical direction; and therefore, an advantage of a foot print area being small is obtained.

A wafer temporary placing table 203 is provided between the upper secondary cleaning module 202A and the lower secondary cleaning module 202B. In the drying chamber 194, an upper drying module 205A and a lower drying module 205B which are arranged along the vertical direction are disposed. The upper drying module 205A and the lower drying module 205B are isolated from each other. On upper portions of the upper drying module 205A and the lower drying module 205B, filter fan units 207 and 207 that respectively supply clean air into the drying modules 205A and 205B are provided. The upper primary cleaning module 201A, the lower primary cleaning module 201B, the upper secondary cleaning module 202A, the lower secondary cleaning module 202B, the temporary placing table 203, the upper drying module 205A and the lower drying module 205B are fixed to a frame not illustrated via bolts or the like.

In the first transfer chamber 191, a first transfer robot (a transfer mechanism) 209 which is movable up and down is disposed. In the second transfer chamber 193, a second transfer robot 210 which is movable up and down is disposed. The first transfer robot 209 and the second transfer robot 210 are movably supported respectively by support shafts 211 and 212 that extend in the vertical direction. The first transfer robot 209 and the second transfer robot 210 have drive mechanisms such as motors inside the first transfer robot 209 and the second transfer robot 210. The first transfer robot 209 and the second transfer robot 210 are movable up and down along the support shafts 211 and 212. The first transfer robot 209 has hands in two stages up and down, similarly to the transfer robot 22. The first transfer robot 209 is disposed in a position where the lower hand is accessible to the aforementioned temporary placing table 180, as shown by the dotted line in FIG. 3A. When the lower hand of the first transfer robot 209 accesses the temporary placing table 180, the shutter (not illustrated) which is provided at the partition wall 1b is opened.

The first transfer robot 209 operates so as to transfer the wafer W among the temporary placing table 180, the upper primary cleaning module 201A, the lower primary cleaning module 201B, the temporary placing table 203, the upper secondary cleaning module 202A, and the lower secondary cleaning module 202B. When transferring a wafer before cleaning (a wafer to which slurry adheres), the first transfer robot 209 uses the lower hand, and when transferring the wafer after cleaning, the first transfer robot 209 uses the upper hand. The second transfer robot 210 operates so as to transfer the wafer W among the upper secondary cleaning module 202A, the lower secondary cleaning module 202B, the temporary placing table 203, the upper drying module 205A and the lower drying module 205B. The second transfer robot 210 transfers only a cleaned wafer; and therefore, includes only one hand. The transfer robot 22 shown in FIG. 1 takes out the wafer from the upper drying module 205A or the lower drying module 205B by using the upper hand, and returns the wafer to a wafer cassette. When the upper hand of the transfer robot 22 accesses the drying modules 205A and 205B, the shutter (not illustrated) which is provided at the partition wall 1a is opened.

<Increase in Substrate Processing Efficiency During Execution of Test>

Next, an increase in substrate processing efficiency during execution of a test on the polishing section and the cleaning section will be described. FIGS. 4 to 7 are diagrams for explaining substrate transfer control by the control section 5. FIGS. 4 to 7 show the configuration of the CMP apparatus by simplifying the configuration in order to simplify explanation.

That is to say, in FIGS. 4 to 7, two of the front load sections 20 are shown to represent the load/unload unit 2. Further, in FIGS. 4 to 7, the first linear transporter 6 is shown to represent the transfer unit which transfers a substrate to the polishing unit 3 from the load/unload unit 2. Further, in FIGS. 4 to 7, the two polishing sections 3A and 3B are shown to represent the polishing unit 3. Further, in FIGS. 4 to 7, the first transfer robot 209 is shown to represent the transfer unit that transfers a substrate to the cleaning unit 4 from the polishing unit 3. Further, in FIGS. 4 to 7, the two cleaning sections 201A and 201B are shown to represent the cleaning unit 4. The above is only illustration for simplifying explanation.

Further, FIGS. 4 to 7 each shows an example of control of substrate transfer in a case of conducting a test after performing maintenance for the cleaning section 201B which is one of the plurality of cleaning sections. However, control of substrate transfer is not limited to the above, and similar control of substrate transfer can be also performed in a case of conducting a test after performing maintenance for one polishing section of the plurality of polishing sections. Further, the present embodiment shows the example in which the polishing unit 3 includes the plurality of polishing sections, and the cleaning unit 4 includes the plurality of cleaning sections, but the present invention is not limited to this. Similar control of substrate transfer can be performed even when the polishing unit 3 includes one polishing section and the cleaning unit 4 includes a plurality of cleaning sections, or when the polishing unit 3 includes a plurality of polishing sections and the cleaning unit 4 includes one cleaning section, for example.

Figure 4:
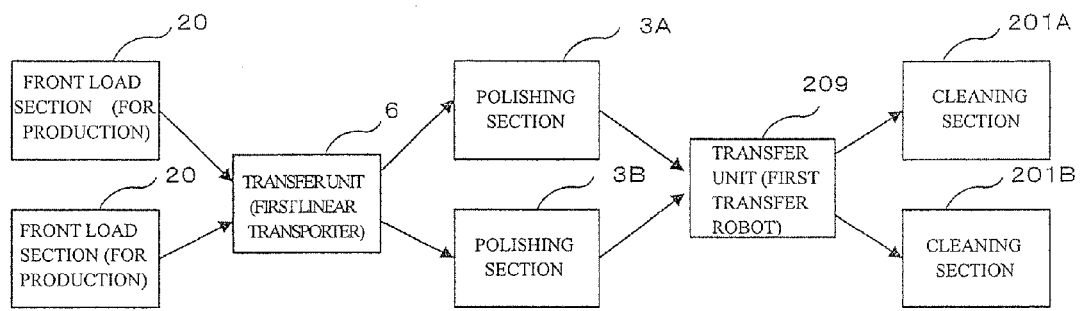
FIG. 4 shows transfer control for a substrate in a normal state in which maintenance and a test are not performed for either control sections of a polishing section or a cleaning section.

FIG. 4 shows substrate transfer control in a normal state in which maintenance and a test are not performed for any of the processing sections of the polishing sections and the cleaning sections. In this case, the control section 5 sets "a normal mode" to the polishing section 3A, the polishing section 3B, the cleaning section 201A and the cleaning section 201B. That is to say, the control section 5 can set the normal mode to the polishing section or the cleaning section to which neither a test mode nor a maintenance mode is set.

Substrates for production are placed in both of the front load sections 20. The substrates for production which are placed in the front load sections 20 are transferred to the polishing section 3A or the polishing section 3B by the first linear transporter 6. Here, the control section 5 causes the first linear transporter 6 to transfer the substrate for production to the polishing section which can perform polishing processing of the substrate for production the soonest out of the polishing sections 3A and 3B to which the normal mode is set.

The substrate for production which is polished by the polishing section 3A or the polishing section 3B is transferred to the cleaning section 201A or the cleaning section 201B by the first transfer robot 209. Here, the control section 5 causes the first transfer robot 209 to transfer the substrate for production to the cleaning section which can perform cleaning processing of the substrate for production the soonest out of the cleaning sections 201A and 201B to which the normal mode is set.

Figure 5:
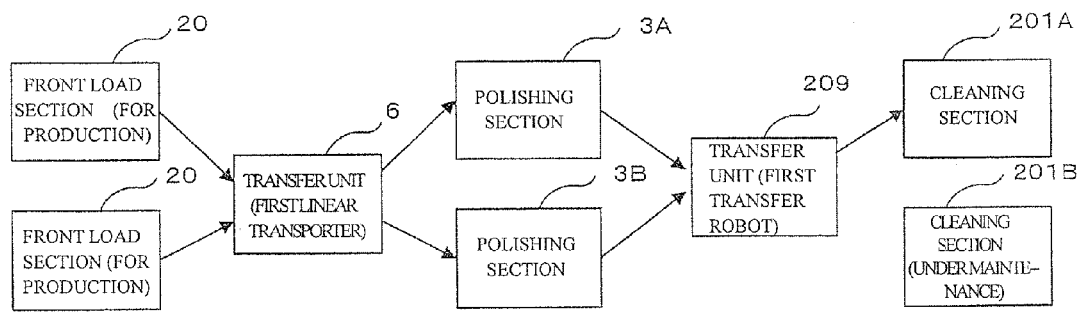
FIG. 5 shows transfer control for a substrate in a maintenance state in which the cleaning section is under maintenance.

FIG. 5 shows substrate transfer control in a maintenance state in which the cleaning section 201B is under maintenance. In this case, the control section 5 sets "the maintenance mode" which is the mode indicating that the cleaning section 201B is under maintenance to the cleaning section 201B while setting the polishing section 3A, the polishing section 3B and the cleaning section 201A at "the normal mode". That is to say, the control section 5 can set "the maintenance mode" to some of the plurality of cleaning sections; and therefore, switches the cleaning section 201B to "the maintenance mode" from "the normal mode".

The substrates for production are placed in both the front load sections 20. The substrate for production which is placed in the front load section 20 is transferred to the polishing section 3A or the polishing section 3B by the first linear transporter 6. Here, the control section 5 causes the first linear transporter 6 to transfer the substrate for production to the polishing section which can perform polishing processing of the substrate for production the soonest out of the polishing sections 3A and 3B to which the normal mode is set.

The substrate for production which is polished by the polishing section 3A or the polishing section 3B is transferred to the cleaning section 201A by the first transfer robot 209. That is to say, the control section 5 causes the substrate for production to be transferred to the cleaning section to which the maintenance mode is not set.

Figure 6:
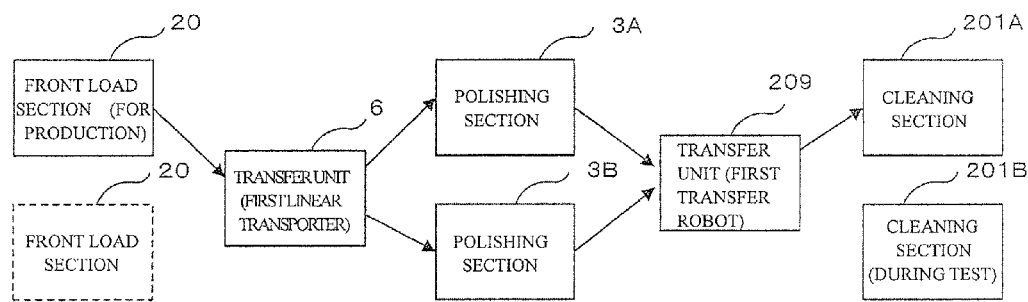
FIG. 6 shows transfer control for a substrate in a state in which a maintenance state of a cleaning section 201B is ended, and the state is shifted to a test state.

FIG. 6 shows substrate transfer control in a state in which the maintenance state of the cleaning section 201B is ended, and the state shifts to the test state. In this case, the control section 5 sets "the test mode" which is the mode that operates the cleaning section 201B for a test, while setting the polishing section 3A, the polishing section 3B and the cleaning section 201A at "the normal mode". That is to say, the control section 5 can set "the test mode" to some of the plurality of cleaning sections; and therefore, switches the cleaning section 201B to "the test mode" from "the maintenance mode". In this manner, when maintenance of some of the plurality of cleaning sections, to which the maintenance mode is set, is ended, the control section 5 can set the test mode to the cleaning sections.

A substrate for production is placed in one of the front load sections 20. Further, a substrate is not placed in the other front load section 20. The substrate for production which is placed in the one of the front load section 20 is transferred to the polishing section 3A or the polishing section 3B by the first linear transporter 6. Here, the control section 5 causes the first linear transporter 6 to transfer the substrate for production to the polishing section which can perform polishing processing of the substrate for production the soonest out of the polishing sections 3A and 3B to which the normal mode is set.

The substrate for production which is polished by the polishing section 3A or the polishing section 3B is transferred to the cleaning section 201A by the first transfer robot 209. That is to say, the control section 5 causes the substrate for production to be transferred to the cleaning section to which the test mode is not set.

Figure 7:
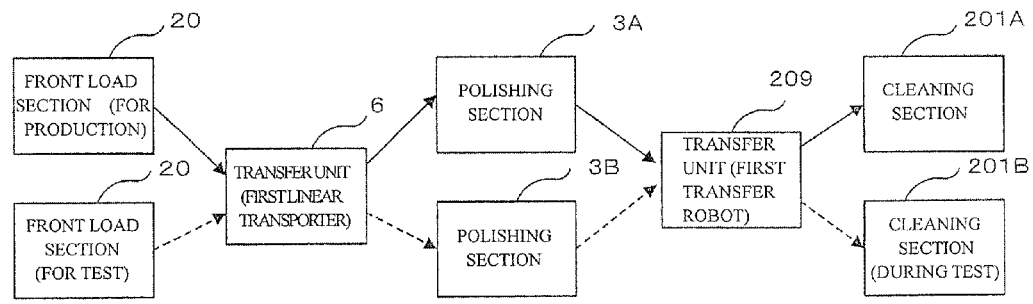
FIG. 7 shows transfer control for a substrate in a state in which a test substrate is transferred to the cleaning section to which a test mode is set.

FIG. 7 shows substrate transfer control in a state in which a test substrate is transferred to the cleaning section 201B to which the test mode is set. In this case, the control section 5 remains to set the polishing section 3A, the polishing section 3B and the cleaning section 201A at "the normal mode", and remains to set the cleaning section 201B at "the test mode".

A substrate for production is placed in one of the front load sections 20. Further, a test substrate is placed in the other front load section 20. The substrate for production which is placed in the one of the front load sections 20 is transferred to the polishing section 3A or the polishing section 3B by the first linear transporter 6. Here, the control section 5 causes the first linear transporter 6 to transfer the substrate for production to the polishing section which can perform polishing processing of the substrate for production the soonest out of the polishing sections 3A and 3B to which the normal mode is set.

The substrate for production which is polished by the polishing section 3A or the polishing section 3B is transferred to the cleaning section 201A by the first transfer robot 209. That is to say, the control section 5 causes the substrate for production to be transferred to the cleaning section to which the test mode is not set.

The test substrate which is placed in the other front load section 20 is transferred to the polishing section 3A or the polishing section 3B by the first linear transporter 6. The test substrate is a substrate for a test on the cleaning section 201 to which the test mode is set. Accordingly, the test substrate may be transferred to the first transfer robot 209 through either the polishing section 3A or the polishing section 3B, or may be transferred to the first transfer robot 209 without passing through the polishing section 3A or the polishing section 3B.

The test substrate is transferred to the cleaning section 201B by the first transfer robot 209. That is to say, the control section 5 causes the test substrate which is different from the substrate for production to be transferred to the cleaning section to which the test mode is set. When the test on the cleaning section 201B is ended, and if there is no problem in the test result, the state is returned to the state in FIG. 4.

<Flowchart>

Figure 8:
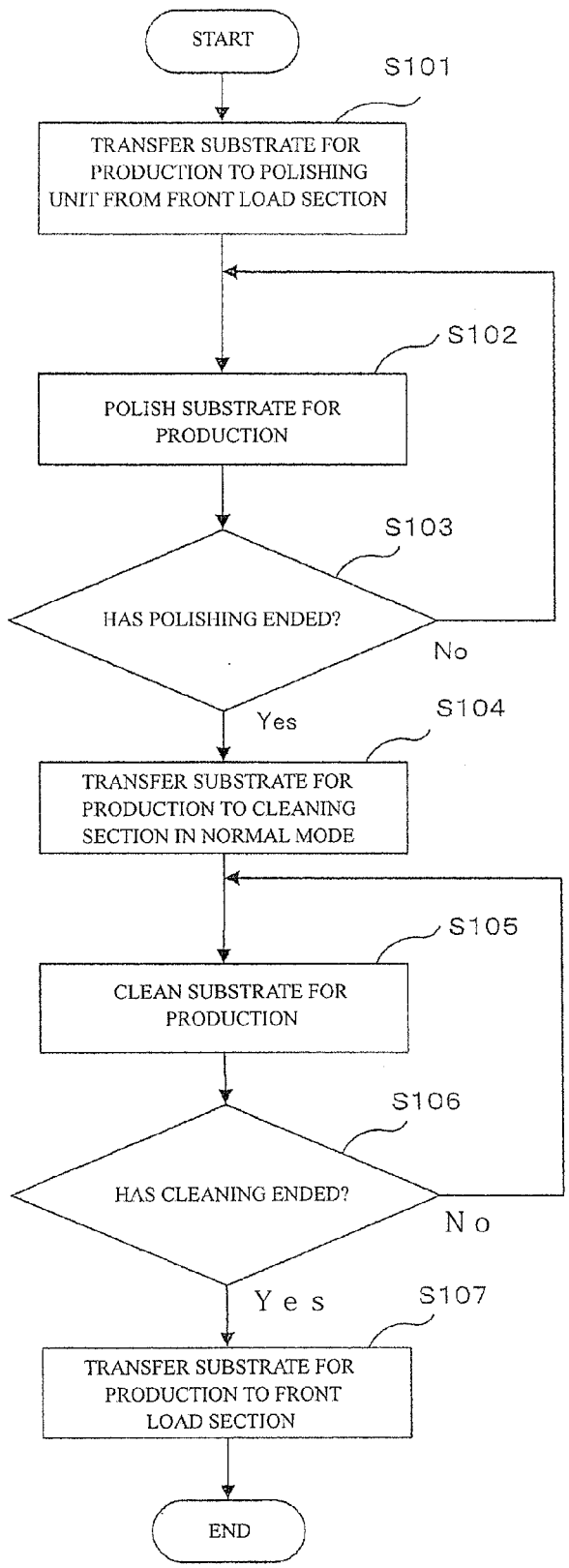
FIG. 8 is a diagram showing a processing flow of a CMP apparatus in a case of transferring a substrate for production.
Figure 9:
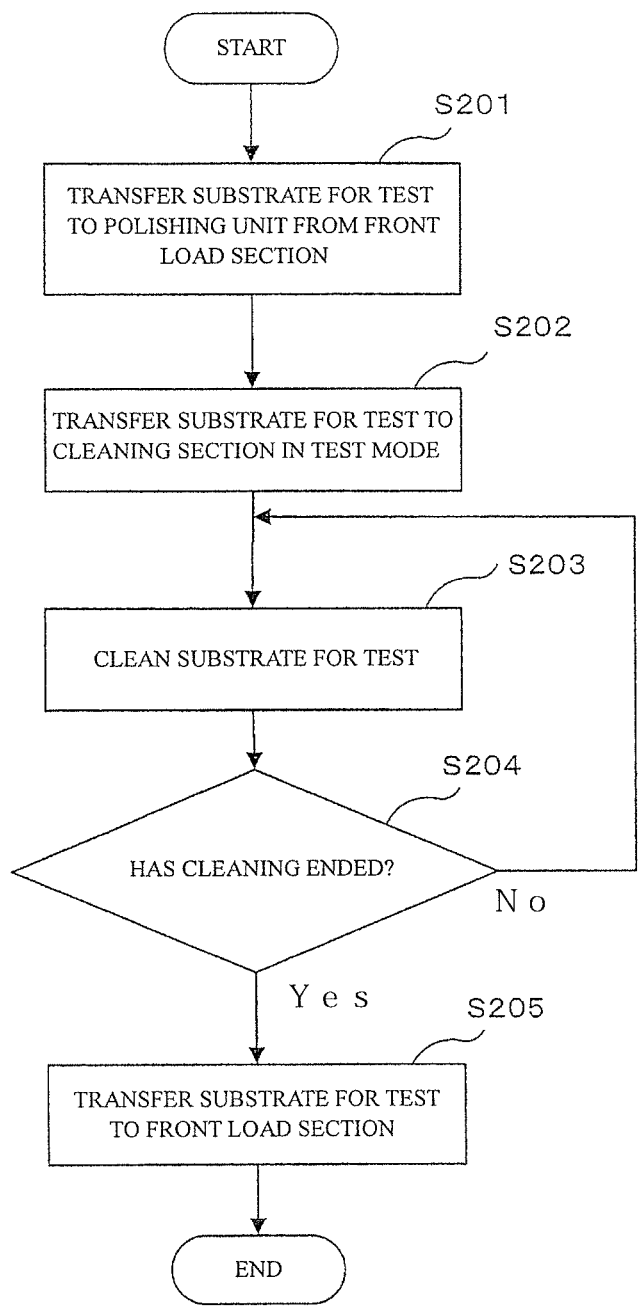
FIG. 9 is a diagram showing a processing flow of the CMP apparatus in a case of transferring a test substrate.

Next, a flow of processing in the CMP apparatus of the present embodiment will be described. FIG. 8 is a diagram showing a processing flow of the CMP apparatus in the case of transferring a substrate for production. FIG. 9 is a diagram showing a processing flow of the CMP apparatus in the case of transferring a test substrate. FIGS. 8 and 9 show an example of control of substrate transfer in the case of conducting a test after performing maintenance for one cleaning section among the plurality of cleaning sections, similarly to FIGS. 4 to 7.

As shown in FIG. 8, concerning transfer of a substrate for production, the control section 5 firstly causes the transfer unit to transfer the substrate for production to the polishing unit 3 from the front load section 20 (step S101). More specifically, the control section 5 causes the transfer unit to transfer the substrate for production to the polishing section which can perform polishing processing of the substrate for production the soonest out of the plurality of polishing sections to which the normal mode is set.

Subsequently, the control section 5 causes the polishing section to which the substrate for production is transferred to polish the substrate for production (step S102). Subsequently, the control section 5 determines whether or not polishing processing in the polishing section is ended (step S103). When the control section 5 determines that the polishing processing in the polishing section is not ended (step S103, No), the control section 5 returns to the processing in step S102.

When the control section 5 determines that the polishing processing in the polishing section is ended (step S103, Yes), the control section 5 causes the transfer unit to transfer the substrate for production to the cleaning section to which the normal mode is set among the plurality of cleaning sections (step S104). More specifically, when there are a plurality of cleaning sections to which the normal mode is set, the control section 5 causes the transfer unit to transfer the substrate for production to the cleaning section which can perform cleaning processing of the substrate for production the soonest out of the plurality of cleaning sections.

Subsequently, the control section 5 causes the cleaning section to which the substrate for production is transferred to clean the substrate for production (step S105). Subsequently, the control section 5 determines whether or not the cleaning processing in the cleaning section is ended (step S106). When the control section 5 determines that the cleaning processing in the cleaning section is not ended (step S106, No), the control section 5 returns to the processing in step S105.

When the control section 5 determines that the cleaning processing in the cleaning section is ended (step S106, yes), the control section 5 causes the transfer unit to transfer the substrate for production to the front load section from the cleaning section (step S107), and ends the processing.

Next, as shown in FIG. 9, concerning a test substrate, the control section 5 firstly causes the transfer unit to transfer the test substrate to the polishing unit 3 from the front load section 20 (step S201).

Subsequently, the control section 5 causes the transfer unit to transfer the test substrate to the cleaning section to which the test mode is set among the plurality of cleaning sections (step S202).

Subsequently, the control section 5 causes the cleaning section to which the test substrate is transferred to clean the test substrate (step S203). Subsequently, the control section 5 determines whether or not the cleaning processing in the cleaning section is ended (step S204). When the control section 5 determines that the cleaning processing in the cleaning section is not ended (step S204, No), the control section 5 returns to the processing in step S203.

When the control section 5 determines that the cleaning processing in the cleaning section is ended (step S204, Yes), the control section 5 causes the transfer unit to transfer the test substrate to the front load section from the cleaning section (step S205), and ends the processing.

As above, according to the present embodiment, substrate processing efficiency during execution of a test on the polishing section or the cleaning section can be increased. That is to say, in the prior art, there has been the risk of a substrate for production being transferred to the polishing section or the cleaning section which is a test target if the test on the polishing section or the cleaning section for which maintenance is ended is to be conducted while processing of a substrate for production is continued, when the maintenance of the polishing section or the cleaning section is ended. Therefore, when a test on the polishing section or the cleaning section is conducted in the prior art, a test substrate is transferred to the polishing section or the cleaning section which is a test target after processing of a substrate for production is stopped. According to the prior art, when a test on the polishing section or the cleaning section is executed, processing of substrates for production is stopped; and therefore, there is the risk of worsening the substrate processing efficiency.

Unlike the prior art, in the present embodiment, the control section 5 can set the test mode which operates the polishing section or the cleaning section for test to some of the plurality of polishing section, or some of the plurality of cleaning sections. Further, the control section 5 causes the substrate for production to be transferred to the polishing section or the cleaning section to which the test mode is not set, and causes the test substrate which is different from the substrate for production to be transferred to the polishing section or the cleaning section to which the test mode is set. Consequently, according to the present embodiment, the substrates for production are transferred to the polishing sections or the cleaning sections which are not test targets, and the test substrate is transferred to the polishing section or the cleaning section which is the test target. Consequently, according to the present embodiment, the substrate for production can be prevented from being transferred to the polishing section or the cleaning section which is the test target. As a result, according to the present embodiment, when maintenance of the polishing section or the cleaning section is ended, a test on the polishing section or the cleaning section maintenance of which is ended can be conducted while processing of the substrates for production is continued.

REFERENCE SIGNS LIST

2 Unload unit
3 Polishing unit
3A Polishing section
3B Polishing section
3C Polishing section
3D Polishing section
4 Cleaning unit
5 Control section
6 First linear transporter
7 Second linear transporter
201A Upper primary cleaning module (Cleaning section)
201B Lower primary cleaning module (Cleaning section)
W Wafer

What is claimed is:

1. A substrate processing apparatus, comprising:
a polishing unit including at least one polishing section configured to polish a substrate;
a cleaning unit including a plurality of cleaning sections configured to clean a substrate polished by the polishing unit;
a load/unload unit configured to deliver a substrate to the polishing unit and receive a substrate from the cleaning unit;
a transfer unit configured to transfer a substrate among the polishing unit, the cleaning unit and the load/unload unit; and
a control section configured to control transfer of a substrate in the transfer unit,
wherein the control section can set a test mode that is configured to operate a first one of the plurality of cleaning sections in a test mode whereby causing the transfer unit to transfer the substrate to a second one of the plurality of cleaning sections to which the test mode is not set, and whereby causing the transfer unit to transfer a test substrate that is different from the substrate to the cleaning section to which the test mode is set.

2. The substrate processing apparatus according to claim 1,
wherein the control section can set a maintenance mode which indicates that the first one of the plurality of cleaning sections is under maintenance and causes the transfer unit to transfer the substrate to the second one of the plurality of cleaning sections to which the maintenance mode is not set.

3. The substrate processing apparatus according to claim 2,
wherein when a maintenance operation of the first one of the plurality of cleaning sections has ended, the control section is configured to set the first one of the plurality of cleaning sections to test mode.

4. The substrate processing apparatus according to claim 2,
wherein the control section can set a normal mode to at least one of the plurality of cleaning sections to which neither the test mode nor the maintenance mode is set, and causes the transfer unit to transfer the substrate to a cleaning section which can perform cleaning processing of the substrate at the earliest time among a plurality of cleaning sections to which the normal mode is set.

5. The substrate processing apparatus according to claim 1,
wherein the control section can set a normal mode to at least one of the plurality of cleaning sections to which neither the test mode nor the maintenance mode is set, and causes the transfer unit to transfer the substrate to a cleaning section which can perform cleaning processing of the substrate at the earliest time among a plurality of cleaning sections to which the normal mode is set.

6. A substrate processing apparatus, comprising:
a polishing unit including a plurality of polishing sections configured to polish a substrate;
a cleaning unit including at least one cleaning section configured to clean a substrate polished by the polishing unit;
a load/unload unit configured to deliver a substrate to the polishing unit and receive a substrate from the cleaning unit;
a transfer unit configured to transfer a substrate among the polishing unit, the cleaning unit and the load/unload unit; and
a control section configured to control transfer of a substrate in the transfer unit,
wherein the control section can set a test mode that is configured to operate a first one of the plurality of polishing sections in a test mode, whereby causing the transfer unit to transfer the substrate to a second of the plurality of polishing sections to which the test mode is not set, and whereby causing the transfer unit to transfer a test substrate that is different from the substrate to the polishing section to which the test mode is set.

7. The substrate processing apparatus according to claim 6,
wherein the control section can set a maintenance mode which indicates that the first one of the plurality of polishing sections is under maintenance, and causes the transfer unit to transfer the substrate to the second one of the plurality of polishing sections to which the maintenance mode is not set.

8. The substrate processing apparatus according to claim 7,
wherein when a maintenance operation of the first one of the plurality of polishing sections has ended, the control section is configured to set the first one of the plurality of polishing sections to test mode.

9. The substrate processing apparatus according to claim 7,
wherein the control section can set a normal mode to at least one of the plurality of polishing sections to which neither the test mode nor the maintenance mode is set, and causes the transfer unit to transfer the substrate to a polishing section which can perform polishing processing of the substrate at the earliest time among a plurality of polishing sections to which the normal mode is set.

10. The substrate processing apparatus according to claim 6,
wherein the control section can set a normal mode to at least one of the plurality of polishing sections to which neither the test mode nor the maintenance mode is set, and causes the transfer unit to transfer the substrate to a polishing section which can perform polishing processing of the substrate at the earliest time among a plurality of polishing sections to which the normal mode is set.

* * * * *